(12) United States Patent
Yamamoto

(10) Patent No.: US 6,689,683 B2
(45) Date of Patent: Feb. 10, 2004

(54) METHOD OF MANUFACTURING A SEMICONDUCTOR DEVICE

(75) Inventor: Yoshiaki Yamamoto, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/146,049

(22) Filed: May 16, 2002

(65) Prior Publication Data
US 2002/0173144 A1 Nov. 21, 2002

(30) Foreign Application Priority Data
May 18, 2001 (JP) ........................................ 2001/148585

(51) Int. Cl.$^7$ ......................................... H01L 21/4763
(52) U.S. Cl. ..................... 438/637; 438/672; 438/673; 438/674; 438/675; 438/700
(58) Field of Search ..................... 438/687, 672–675, 438/637–639

(56) References Cited

U.S. PATENT DOCUMENTS 6,232,230 B1 * 5/2001 Iacoponi ..................... 438/687

FOREIGN PATENT DOCUMENTS

| EP | 1 069 612 A2 | * 1/2001 |
| JP | 2000-183160 | 6/2000 |

* cited by examiner

Primary Examiner—Dung A Le
(74) Attorney, Agent, or Firm—McGinn & Gibb, PLLC

(57) ABSTRACT

A method of manufacturing a semiconductor device forms a agglomeration-free seed layer on the inner surface of a recessed portion so as to restrain voids in a metal filled by the plating method. The method includes forming a barrier metal layer on a surface of the recessed portion, forming a seed layer on the barrier metal layer, and forming a metal filled in the recessed portion by the plating method making use of the seed layer. The method further includes retaining the water for 50 seconds or more, after forming the barrier metal layer, in a chamber with a vacuum state set therein other than the seed layer forming chamber.

18 Claims, 11 Drawing Sheets

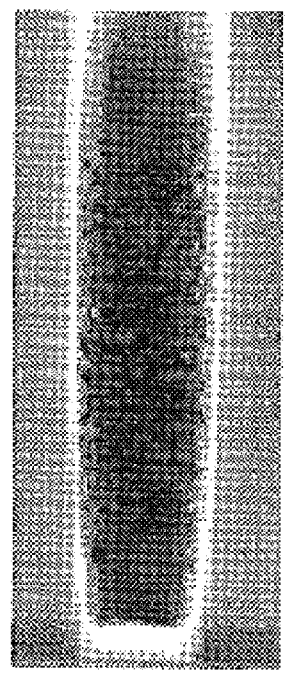
FIG.8
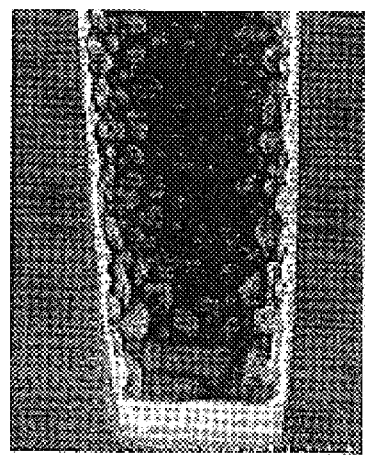 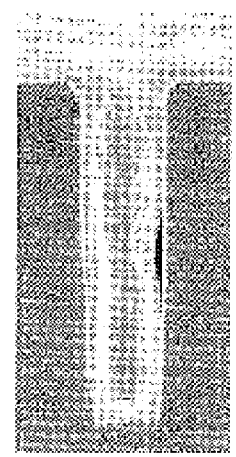
FIG.9A    FIG.9B

METHOD OF MANUFACTURING A SEMICONDUCTOR DEVICE

BACKGROUND OF THE INVENTION

1. Field of the Invention

The present invention generally relates to a method of manufacturing a semiconductor device and particularly, but not limited to, a method of forming a barrier metal and a metal buried in a depression formed in a substrate. The present application is based on Japanese Patent Application No. 2001-148585, which is incorporated herein by reference.

2. Description of the Related Art

Conventional semiconductor integrated circuits have been using, as a material for metal wiring, aluminum or an aluminum-based metal composed of an aluminum alloy because these materials exhibit lower specific resistance and permit easier patterning. Recently, however, a Cu or Cu-based metal composed of a Cu alloy is being used that exhibits lower resistivity and higher electromigration (EM) resistance than those of aluminum-based metals. This trend is based on the recent increasing demand for higher integration, more compactness, higher speed, and higher reliability in semiconductor integrated circuit, such as LSIs.

To make wires by using such a Cu-based metal, it is difficult to form a desired wire because the Cu-based metal does not permit easy dry etching. A method has been disclosed in Japanese Patent Application Laid-Open No. 2000-183160, wherein a concave (trench) of a wiring pattern is formed in an interlayer dielectric, a Cu film is deposited on the entire surface, the trench is embedded, and chemical mechanical polishing (CMP) is carried out to remove the Cu film exposed on the interlayer dielectric so as to form an embedded wiring with the Cu film left in the trench. This technique is known as a damascene process. The damascene process may be divided into a single damascene process whereby only wiring is formed and a dual damascene process whereby contact holes or via holes for the connection with the wiring of a lower layer are also formed in addition to wiring. The dual damascene structure permits the number of steps to be reduced, thus contributing to reduced cost. As the method for filling a wire or the recessed portion between a wire and a via hole with a Cu film, the high-temperature reflow method, the sputtering method, and the electrolytic plating method are known, among which the electrolytic plating method is ideally used for filling a recessed portion exhibiting a high aspect ratio.

FIGS. 1A through 1E illustrate the dual damascene process. Referring to FIG. 1A, a first metal wire 103 having a barrier metal layer 102 and an interlayer dielectric 104 covering the first metal wire 103 are formed on a semiconductor substrate 101 on which elements have been formed. Then, a wiring trench 105 and a via hole 106 connected to the first metal wire 103 through the trench 105 are opened in the surface of the interlayer dielectric 104 by lithography and dry etching. Subsequently, as shown in FIG. 1B and FIG. 1C, a barrier metal layer 107 made of Ta or the like and a seed layer 108 made of Cu or the like are formed in sequence onto the inner surfaces of the trench 105 and the via hole 106 by a barrier metal/seed layer forming apparatus. The barrier metal layer and the seed layer are processed in the same vacuum atmosphere. Thereafter, as shown in FIG. 1D, the recessed portion of the via hole 106 and the trench 105 is filled with a plating metal 109 by plating method or the like wherein the seed layer 108 provides a plating electrode. The plating metal 109 is formed integrally with the seed layer 108. Next, as shown in FIG. 1E, the plating metal 109, the seed layer 108, and the barrier metal layer 107 that expose on the interlayer dielectric 104 are polished to be removed by the CMP method so as to form a second wire 110 and a contact hole 111 filled with the metal. Repeating the above procedure forms multilayer wiring.

To fill the recessed portion of the trench and via hole or the like with a metal film formed of Cu or the like by the electrolytic plating method, it is necessary to form a seed Cu layer providing a cathode in the plating process on the side surfaces and the bottom surface of the recessed portion in advance. By using the sputtering method, the barrier metal layer, which provides a Cu barrier layer, and the seed Cu layer are formed on the interlayer dielectric including the recessed portion, then plating is carried out to fill the recessed portion with Cu, using the seed layer as the cathode.

There has been accelerating demand for smaller wiring widths with the increasing microminiaturization of semiconductor integrated circuits. With this trend, the aspect ratios of trench and via holes are increasing. Via holes having an aspect ratio exceeding 4, for example, require filling by Cu. However, in the case of the trench and via hole or the like having high aspect ratios, as shown in the photograph of FIG. 8 and FIG. 11 showing the schematic diagrams of the photograph of FIG. 8, when an attempt is made to form the seed Cu layer 108 by sputtering on the bottom surface and side surfaces thereof after forming the barrier metal layer 107 on the inner surface of the recessed portion 106, there are some cases where adequate coverage is not accomplished.

Especially on the side surfaces near the bottom of the recessed portion 106, the seed Cu layer 108 is attached in a minute island state rather than being a continuous layer. For this reason, in this area, Cu hardly or insufficiently grows from the seed Cu layer 108 even when the plating is carried out. This happens because a Cu electrolytic plating bath ($CuSO_4 \cdot 5H_2O + H_2SO_4$) exhibits strong acidity, so that the island-like seed Cu layer is melted away by the electrolytic plating bath faster than the growth of the Cu layer by the plating. Thus, the Cu is grown by the plating in the upper area of the recessed portion 106, that is, the area where the seed Cu layer 108 has been continuously formed, while Cu hardly or insufficiently grows in the lower area of the recessed portion 106, that is, the area where the seed Cu layer 108 has been formed in the island state. As a result, the recessed portion 106 cannot be completely filled with Cu, leading to the formation of voids.

To improve the poor formation the seed layer on the lower area of the recessed portion, it can be considered to increase the thickness of the seed layer by, for example, extending the sputtering time. In this case, however, the seed layer would be thick at the opening of the recessed portion, causing the seed layer to considerably overhang. As a result, the Cu that has grown at the opening before the filling of the recessed portion is completed may close or pinch off the opening, causing a large void to be formed in the recessed portion. Therefore, the thickness of the seed layer cannot be increased much.

As a solution to the above problem, Japanese Unexamined Patent Publication No. 2000-183160 has disclosed a method in which the seed layer formed by electroless plating is reinforced to prevent the seed layer from being formed in an island state, then electrolytic plating is carried out to charge Cu. According to this method, however, a plating apparatus is required to be additionally equipped with a plating bath for performing the electroless plating, posing a problem of a more complicated apparatus. This is another problem in that the electroless plating is generally poor in the aspect of stability and reproducibility, leading to poor mass productivity.

To improve the coverage of a seed layer, it is conceivable to use a long slow sputtering method in which the distance between a substrate and a target is set to be longer than usual or an ionized sputtering method in which Cu is ionized and Cu ions are positively drawn into a recessed portion by applying a substrate bias. However, even if these methods are used, because the side walls of the recessed portion have a relatively thinner seed Cu layer, the temperature of the substrate increases due to the bombardment of sputtered atoms, ions, etc. during a sputtering process, leading to a problem in that the seed Cu layer agglomerates. More specifically, the seed Cu layer formed on a barrier metal layer tends to minimize the energy of the Cu layer itself; therefore, if it is subjected to a temperature or other type of energy that is sufficient to provide the surface migration of Cu atoms, then it agglomerates. The agglomeration that takes place when the seed Cu layer is formed with the temperature of the holder for forming the seed Cu layer being set at 80° C. is shown by the photograph of FIG. 9A and FIG. 12A, which is a schematic diagram of the photograph of FIG. 9A. When the temperature during the layer formation is high, the seed Cu layer 108 agglomerates in the island state. If Cu plating is carried out using the seed Cu layer that has agglomerated as mentioned above, the embedding failure of Cu 109 occurs, as shown in the photograph of FIG. 9B and FIG. 12B, which is a schematic diagram of the photograph of FIG. 9B. More specifically, when plating is carried out to fill the trench with a plating metal, the seed Cu layer on the substrate provides the cathode for the plating. No or insufficient Cu precipitation takes place in an area not covered by the seed Cu layer, resulting in filling failure. Hence, an embodiment in accordance with the present invention takes a manufacturing method described below.

SUMMARY OF THE INVENTION

A first aspect of the method of manufacturing semiconductor device according to the present invention comprises cooling a semiconductor substrate for such a time which prevents a seed layer from cohering before transferring the semiconductor substrate into a seed layer forming chamber at a predetermined temperature in a barrier metal layer and a seed layer forming process. In a second aspect of the present invention, the predetermined temperature is preferably 40 centigrade below zero. In a third aspect of the present invention, cooling the semiconductor substrate is preferably performed in a barrier metal forming chamber in a vacuum. In a fourth aspect of the present invention, cooling the semiconductor substrate is preferably performed in a chamber other than the seed layer forming chamber or the barrier metal forming chamber.

In order to restrain the agglomeration of the seed layer caused by a rise in temperature, the temperature during the formation of the seed layer, e.g., the temperature of the wafer holder for retaining a wafer, is lowered as much as possible, to cool a semiconductor substrate to preferably −40° C. However, a agglomeration-free, smooth seed layer cannot be produced simply by maintaining a low temperature during the formation of the seed layer. This is because a temperature rise in a substrate while the barrier metal layer is being formed before the seed layer is formed is considered to affect the formation of the seed layer. For example, the time for cooling a wafer before forming the seed layer is set to 60 seconds, and the time for forming the seed layer is set to 60 seconds, so that the total treatment time in the chamber for forming the seed layer is 120 seconds (the 60-second cooling time plus the 60-second layer forming time). The total time for forming the barrier metal layer is set to 50 seconds. The treatment can be accomplished by using one chamber for forming a barrier metal layer and another chamber for forming a seed layer, as shown in the timing chart of FIG. 2A, which is referred to as "single mode". In this case, the time for forming the seed layer is longer than the time for forming the barrier metal layer. Therefore, while a wafer is under the treatment, the next wafer waits for about 70 seconds in the chamber for forming the barrier metal layer, then the wafer is carried into the chamber for forming the seed layer to cool the wafer and deposit the layer thereon. It has been verified that this case permits the restraint of the agglomeration of the seed layer. In FIG. 2A, the thick lines indicate the processing time, while the thin lines indicate the waiting time.

As shown in FIG. 3A, it has been verified that the agglomeration of the seed layer can be restrained by setting the waiting time in the barrier metal layer forming chamber after the barrier metal layer has been formed to 50 seconds or more, as a result of a test performed by the invention.

The seed layer may be formed using seed layer forming chambers A and B in parallel, which is the comparative example, as shown in the timing chart of FIG. 2B. This case is referred to as "dual mode". In the dual mode, the time for which a wafer waits in the barrier metal layer forming chamber after the barrier metal layer has been deposited is reduced to 10 seconds or less, permitting higher processing efficiency to be achieved. However, despite the 60-second cooling in the seed layer forming chamber, the seed layer has developed agglomeration. In FIG. 2B, the thick lines indicate the processing time, while the thin lines indicate the waiting time. In this case, the agglomeration of the seed layer cannot be restrained even by extending the cooling time in the seed layer forming chamber to 120 seconds, as shown in FIG. 3B.

The single mode and the dual mode require the same time for the transfer from the barrier metal layer forming chamber to the seed layer forming chamber. The waiting time of a wafer in the barrier metal layer forming chamber is 70 seconds in the single mode, while it is 10 seconds in the dual mode. The difference in the waiting time significantly influences the agglomeration of the seed layer. As shown in FIG. 3A, the agglomeration problem of the seed layer can be solved by retaining a wafer in the barrier metal layer forming chamber for 50 seconds or more to cool the wafer after completing the deposition of the barrier metal layer, then carrying the wafer into the seed layer forming chamber to deposit the seed layer.

BRIEF DESCRIPTION OF THE DRAWINGS

Features of the illustrative, non-limiting embodiments of the present invention will be more apparent from the following description taken in conjunction with the accompanying drawings, in which:

FIG. 8 is a picture of a seed layer in a relative art;

FIG. 9A is a picture of a seed layer in a relative art;

FIG. 9B is a picture of a buried metal in a relative art;

DETAILED DESCRIPTION OF THE EMBODIMENTS

The following description of the embodiments discloses specific configurations, features, and operations. However, the embodiments are merely examples of the present invention, and thus, the specific features described below are merely used to more easily describe such embodiments and to provide an overall understanding of the present invention. Accordingly, one skilled in the art will readily recognize that the present invention is not limited to the specific embodiments described below. Furthermore, the descriptions of various configurations, features, and operations of the present invention that would have been known to one skilled in the art are omitted for the sake of clarity and brevity.

Figure 1A:
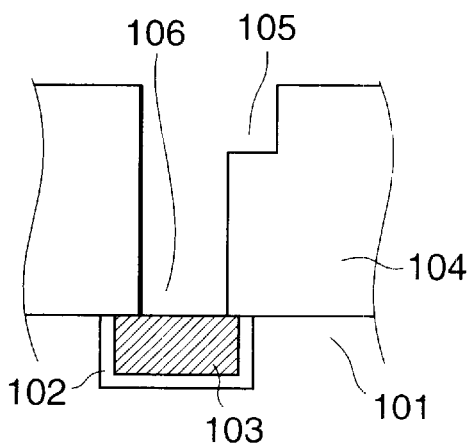
FIGS. 1A to 1E are sectional views showing a method of manufacturing a semiconductor device according to the first and second embodiment of the present invention.
Figure 1B:
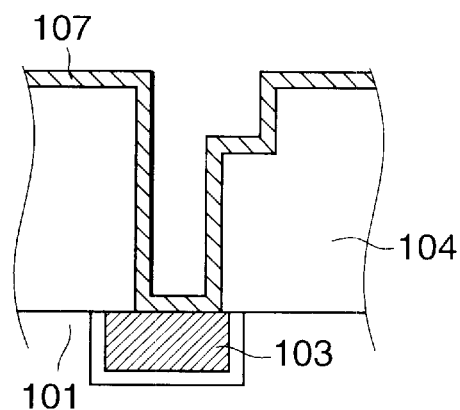
Figure 1C:
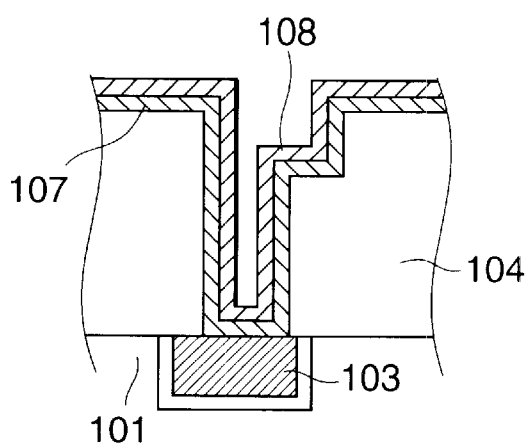
Figure 1D:
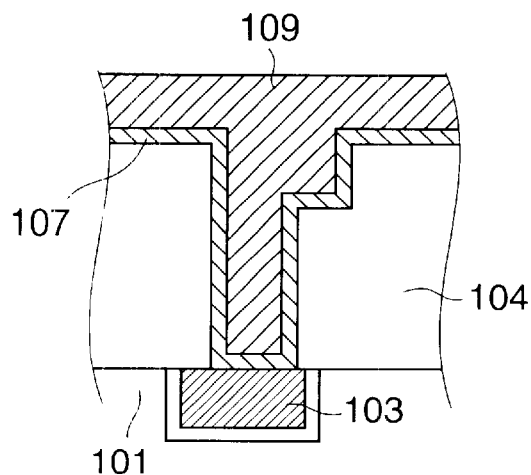
Figure 1E:
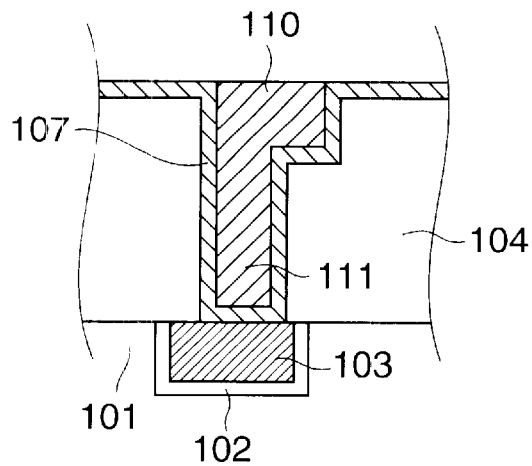

In a first embodiment, as shown in FIG. 1A, a first metal wire 103 having a barrier metal layer 102 is formed on a semiconductor substrate 101 on which elements have been formed, and an interlayer dielectric 104 is formed on the surface thereof. Then, a trench 105 serving as wiring and a via hole 106 are respectively formed by lithography and dry etching. Subsequently, as shown in FIG. 1B, a barrier metal layer 107 is formed on the entire surface of the interlayer dielectric 104 including the trench 105 and the via hole 106. Furthermore, as shown in FIG. 1C, a seed layer 108 is formed on the barrier metal layer 107. then, as shown in FIG. 1D, the trench 105 and the via hole 106 are filled with a plating metal 109 by metal plating according to the plating method wherein the seed layer 108 provides the cathode. The surface of the interlayer dielectric 104 is polished by the chemical mechanical polishing (CMP) method. This leaves the metal 109 only in the trench 105 and the via hole 106, thus forming a wire 110 and a via hole 111. The barrier metal layer 107 is formed of a Ta film, the seed layer 108 is formed of a Cu film, and the plating metal 109 is formed of Cu. The barrier metal layer 107 may be formed of a laminated layer comprising a TaN film and a Ta film.

Figure 4:
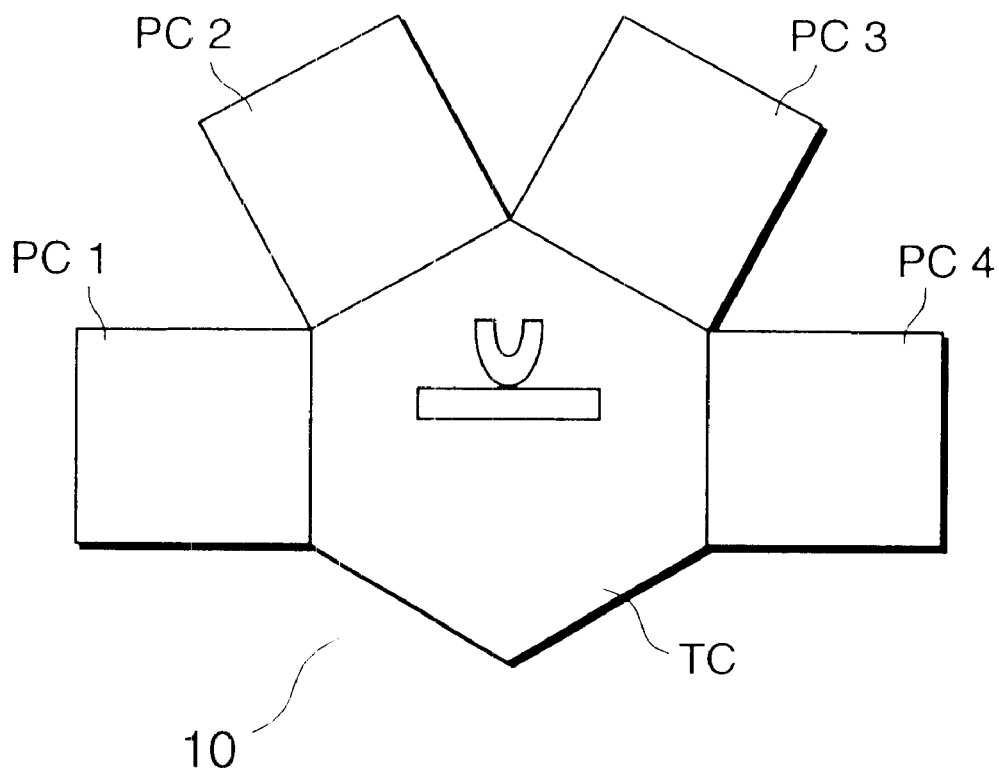
FIG. 4 is a brief view showing an explanatory view for a metal layer and seed layer forming apparatus.

The barrier metal layer 107 and the seed layer 108 are formed by a barrier metal/seed layer forming apparatus 10, as shown in FIG. 4. The barrier metal/seed layer forming apparatus 10 has a plurality of processing chambers, e.g., four, namely, first through fourth processing chambers PC1 through PC4. Inside the chambers PC1 through PC4 is vacuum and wafers, i.e., semiconductor substrates, can be transferred between the processing chambers by a transporting chamber TC while being maintained under vacuum condition. The first processing chamber PC1 serves as a sputtering pretreatment chamber for performing pretreatment on a wafer. The second processing chamber PC2 serves as a barrier metal layer forming chamber in which a barrier metal layer is formed on a wafer by sputtering. The barrier metal layer may alternatively be formed by the chemical vapor deposition (CVD). In the first embodiment, the sputtering is used. The third processing chamber PC3 serves as a seed layer forming chamber in which a seed layer is formed on a wafer by sputtering.

Figure 5:
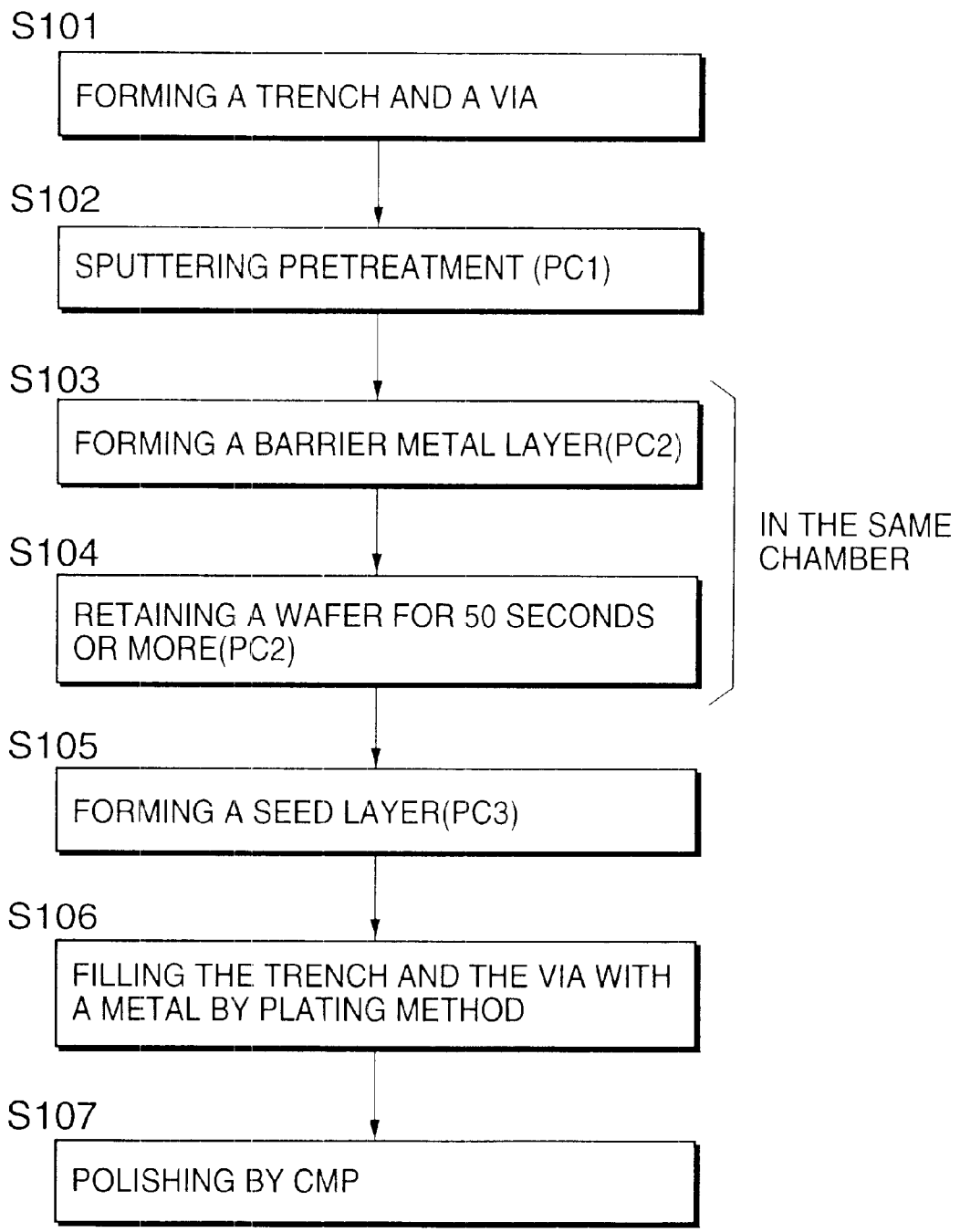
FIG. 5 is a flow chart showing a first embodiment of the present invention.

Descriptions will now be given of the method for making the dual damascene structure shown in FIG. 1 by using the barrier metal/seed layer forming apparatus 10. FIG. 5 is a flowchart illustrating the process for forming the barrier metal layer and the seed layer according to the first embodiment of the present invention. First, the trench 105 and the via hole 106 are etched in the interlayer dielectric 104 on a wafer (S101). Then, the wafer is placed in the first processing chamber PC1 serving as the sputtering pretreatment chamber to carry out the sputtering pretreatment (S102). In the sputtering pretreatment, for example, an Ar plasma is produced in a vacuum to perform etching of a surface oxide film or the like by Ar ions. Subsequently, the wafer is placed in the second processing chamber PC2 serving as a barrier metal layer forming chamber to form the barrier metal layer 107 by sputtering (S103). During the barrier metal sputtering process, the temperature of the wafer increases due to the bombardment of sputtering atoms, ions or the like; hence, the wafer is retained for 50 seconds or more in the same second processing chamber PC2 to cool the wafer after the barrier metal layer 107 has been produced (S104). Next, the wafer is carried into the third processing chamber PC3 serving as the seed layer forming chamber. In the seed layer forming chamber PC3, a wafer holder for retaining the wafer has been cooled to −40° C. to cool the wafer before the seed layer 108 is formed, then the seed layer 108 is produced by sputtering (S105). After that, the trench 105 and the via hole 106 are filled with the metal 109 by the plating method using the seed layer 108 as an electrode (S106). Then, the surface of the interlayer dielectric 104 is polished by the CMP method to planarize the surface, thereby leaving the metal 109 only in the trench 105 and the via hole 106 to form the wire 110 and the contact hole 111 (S107). In the first embodiment, after forming the barrier metal layer is completed on the first wafer treated in the manufacturing process, the first wafer waits for 50 seconds in the chamber for forming the barrier metal layer, although there is no substrate in the seed layer forming chamber.

Figure 3A:
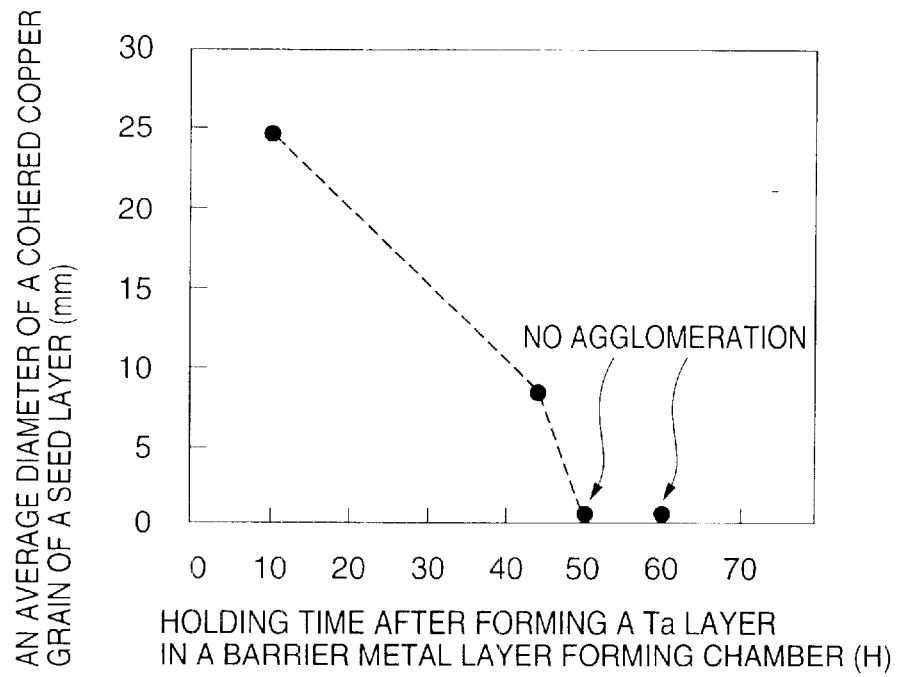
FIG. 3A is a characteristic chart showing an average diameter of a cohered copper grain of a seed layer for a wafer keeping time in a chamber where a barrier metal layer is formed in a first embodiment of the present invention.
Figure 3B:
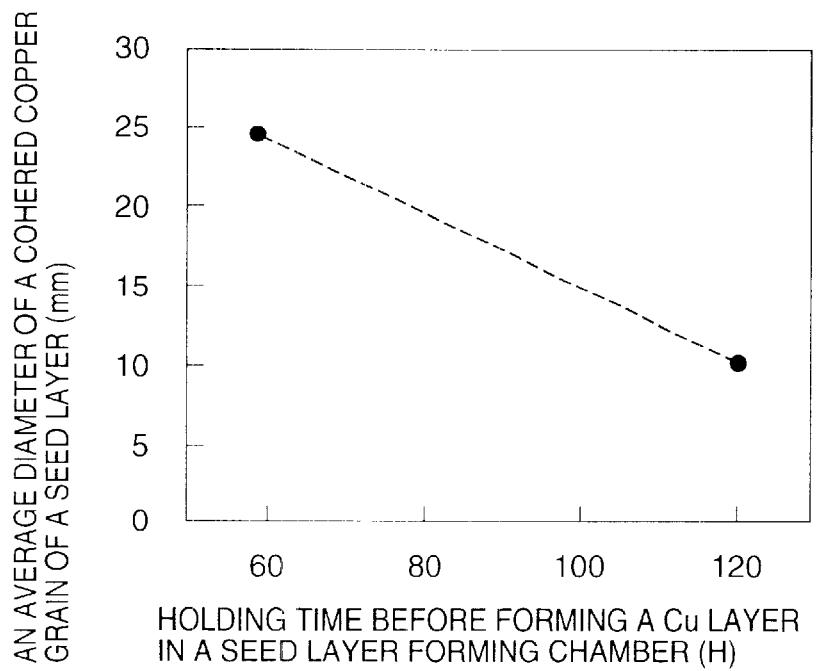
FIG. 3B is a characteristic chart showing an average diameter of a cohered copper grain of a seed layer for a wafer keeping time in a chamber where a seed layer is formed in a relative example.
Figure 6A:
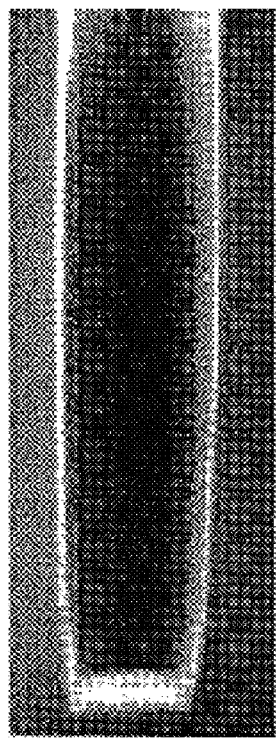
FIG. 6A is a picture of a barrier metal layer in embodiments of the present invention.
Figure 6B:
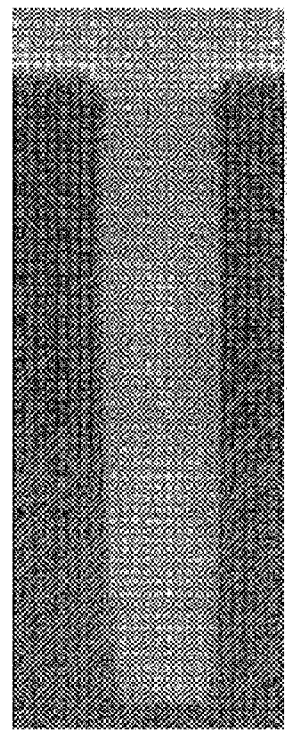
FIG. 6B is a picture of a seed layer and a buried metal in embodiments of the present invention.
Figure 10A:
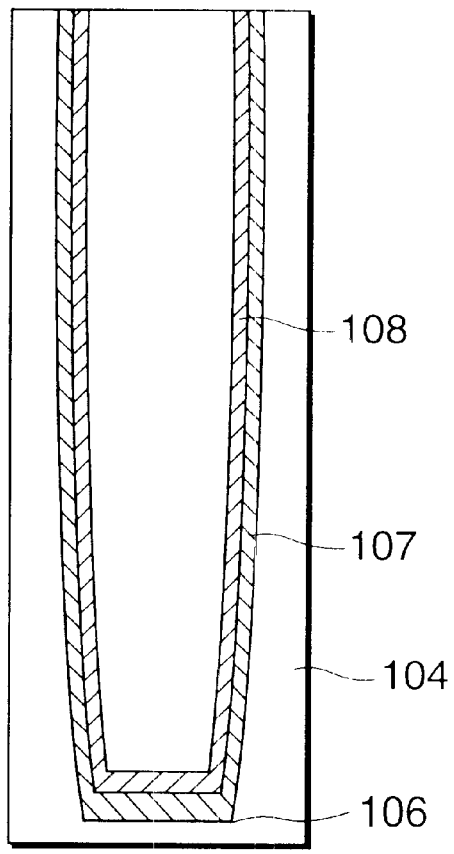
FIGS. 10A and 10B are illustrations corresponding to FIGS. 6A and 6B.
Figure 10B:
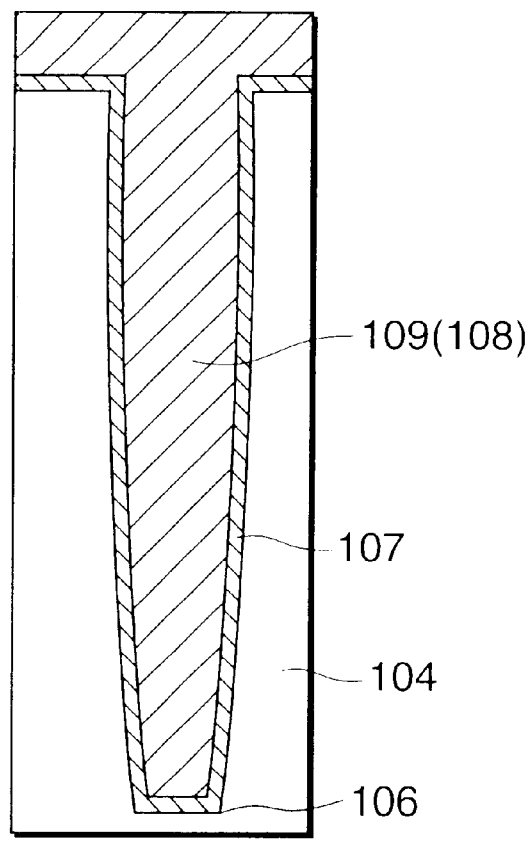
Figure 11:
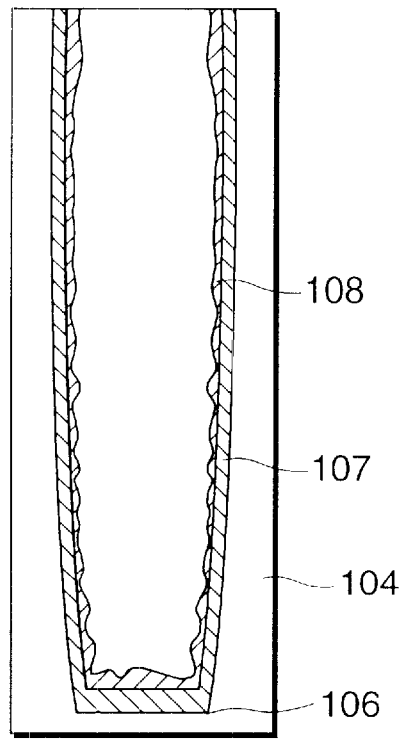
FIG. 11 is an illustration corresponding to FIG. 8.
Figures 12A, 12B:
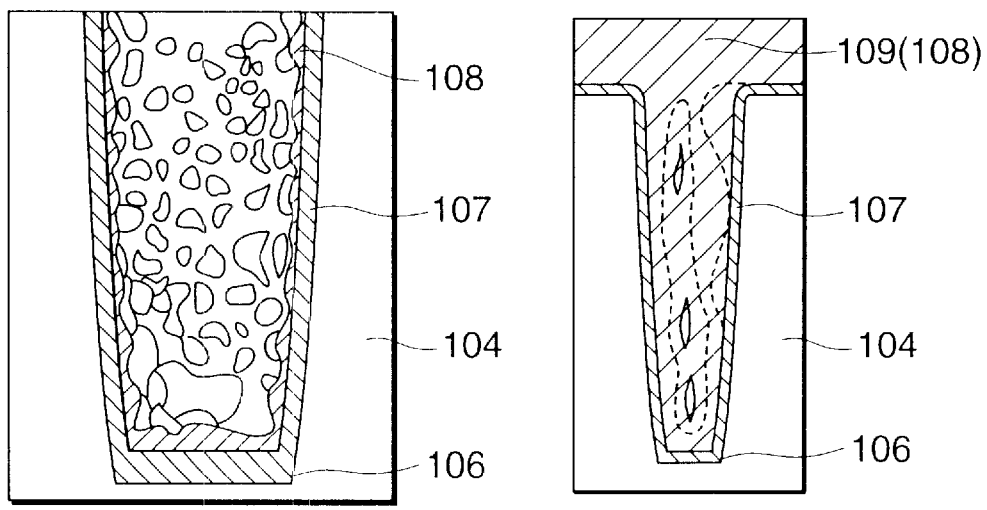
FIGS. 12A and 12B are illustrations corresponding to FIGS. 9A and 9B.

To cool a wafer that has become hot during the process for forming the barrier metal layer prior to the process for depositing the seed layer, a first technique and a second technique have been tried. The results of the two techniques were compared in the agglomerated particle diameter of the seed layer. In the first technique, the wafer on which the barrier metal layer has been deposited is transferred into the seed layer forming chamber wherein the wafer is cooled for a predetermined cooling time before the seed layer is deposited thereon. In the second technique, following the formation of the barrier metal layer, the wafer is cooled for a predetermined cooling time in the same chamber, then the wafer is transferred into the seed layer forming chamber to deposit the seed layer. The results of the agglomeration of the seed layer in the first technique and the second technique are shown in FIG. 3. In the first technique, the agglomeration of the seed layer cannot be restrained even when the cooling time is extended in the seed layer forming chamber to 120 seconds as shown in FIG. 3B. On the other hand, in the second technique, the agglomeration of the seed layer is restrained when a wafer is retained in the barrier metal layer forming chamber for 50 seconds or more to cool the wafer after completing the forming of the barrier metal layer. As shown in the photograph of FIG. 6A and FIG. 10A, which is a schematic diagram of FIG. 6A, the seed layer 108 formed by the second technique looks satisfactory and free from agglomeration. Furthermore, the metal 109 can be smoothly embedded by the subsequent plating process, as shown in the photograph of FIG. 6B and FIG. 10B, which is a schematic diagram of FIG. 6B. The first embodiment is described in a single mode, but it may be applicable to a dual mode.

The embodiment is an example of the dual damascene method, where a trench and a via hole are covered by a barrier metal layer in the same step, are covered by a seed layer in the same step, and then are filled with a metal in the same step; however, the present invention can be applied also to the single damascene method, where a trench and a via hole are covered by a barrier metal layer in separated steps respectively, are covered by a seed layer in separated steps respectively, and are filled with a metal in separated steps respectively. Also, the embodiment may be applicable to a method, where not only a trench and a via hole are covered by a seed layer and are filled with a metal but also a trench is covered by a seed layer and is filled with a metal generally.

According to the first embodiment, the wafer is retained in the barrier metal layer forming chamber for 50 seconds or more after the barrier metal layer has been formed. However, the chamber does not have to be the same single chamber. In other words, the wafer may alternatively be retained in another chamber maintain the same environmental conditions as those in the barrier metal layer forming chamber, the vacuum condition being maintained after the barrier metal layer has been formed. According to a second embodiment, the barrier metal/seed layer forming apparatus 10 shown in FIG. 4 is used. The first processing chamber PC1 serves as the sputtering pretreatment chamber, the second processing chamber PC2 serves as a barrier metal layer forming chamber, the third processing chamber PC3 serves as a waiting chamber, and the fourth processing chamber PC4 serves as a seed layer forming chamber.

Figure 2A:
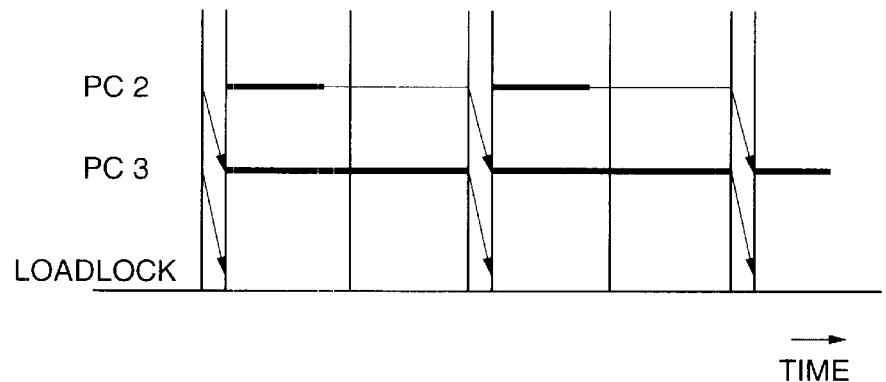
FIG. 2A is a timing chart showing a process for time in a single mode.
Figure 2B:
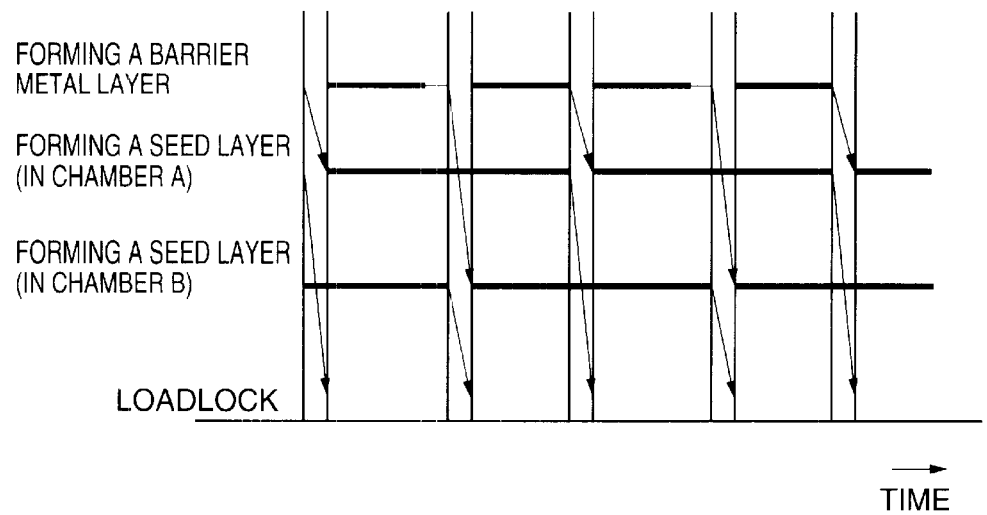
FIG. 2B is a timing chart showing a process for time in a dual mode.
Figure 2C:
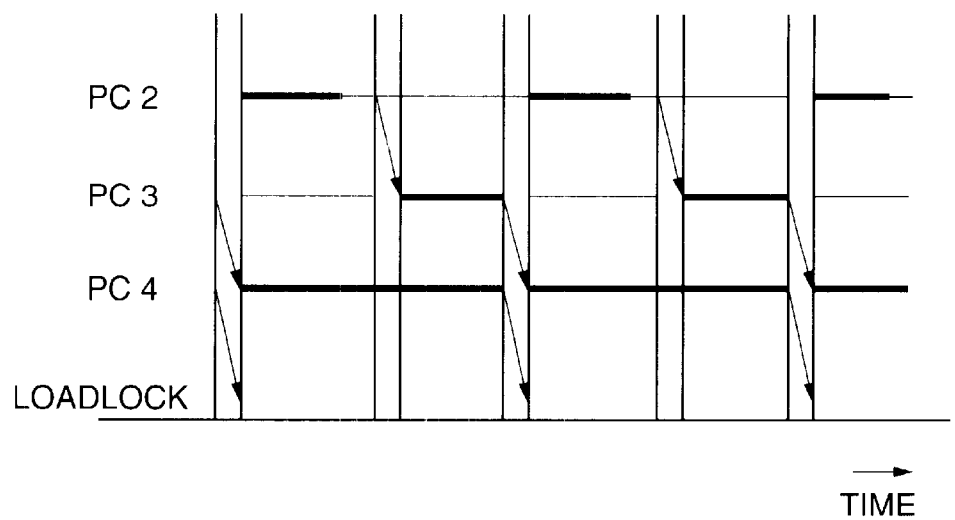
FIG. 2C is a timing chart showing a process for time in the second embodiment of the present invention.
Figure 7:
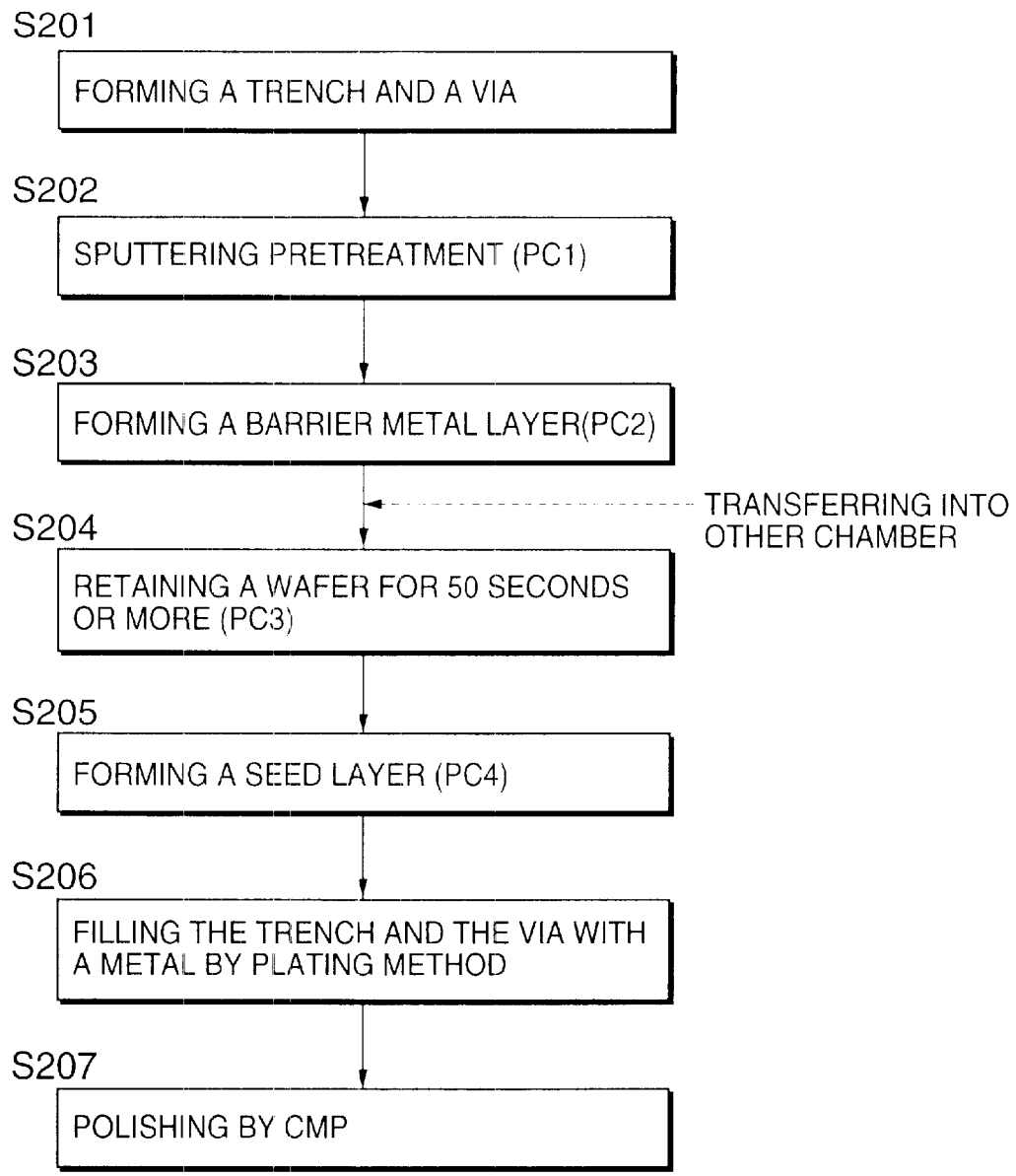
FIG. 7 is a flow chart showing a third embodiment of the present invention.

FIG. 7 is a flowchart illustrating the process for manufacturing a dual damascene structure shown in FIGS. 1A through 1E in the second embodiment in accordance with the present invention. The trench 105 and the via hole 106 are formed (S201) in the same manner as that in the first embodiment. The step for carrying out the sputtering pretreatment in the first processing chamber PC1 (S202) and the step for forming the barrier metal layer 107 in the second processing chamber PC2 (S203) are the same as those of the first embodiment. After the barrier metal layer 107 is formed, the wafer is moved into the third processing chamber PC3 providing substantially the same environmental conditions, while being maintained in the vacuum condition, and the wafer is retained in the chamber PC3 for 50 seconds or more (S204). Thereafter, the wafer is carried into the fourth processing chamber PC4 wherein it is cooled, then the seed layer 108 is formed (S205). Subsequently, the metal 109 is embedded in the trench 105 and the via hole 106 by the plating method in which the seed layer 108 is used as an electrode (S206). After that, the surface of the interlayer dielectric 104 is polished by the CMP method to planarize the surface to leave the metal 109 only in the trench 105 and the via hole 106, thereby forming the wire 110 and the contact hole 111 (S207). This process is also the same as that in the first embodiment. FIG. 2C is a timing chart showing a process for time in the second embodiment.

Figure 2D:
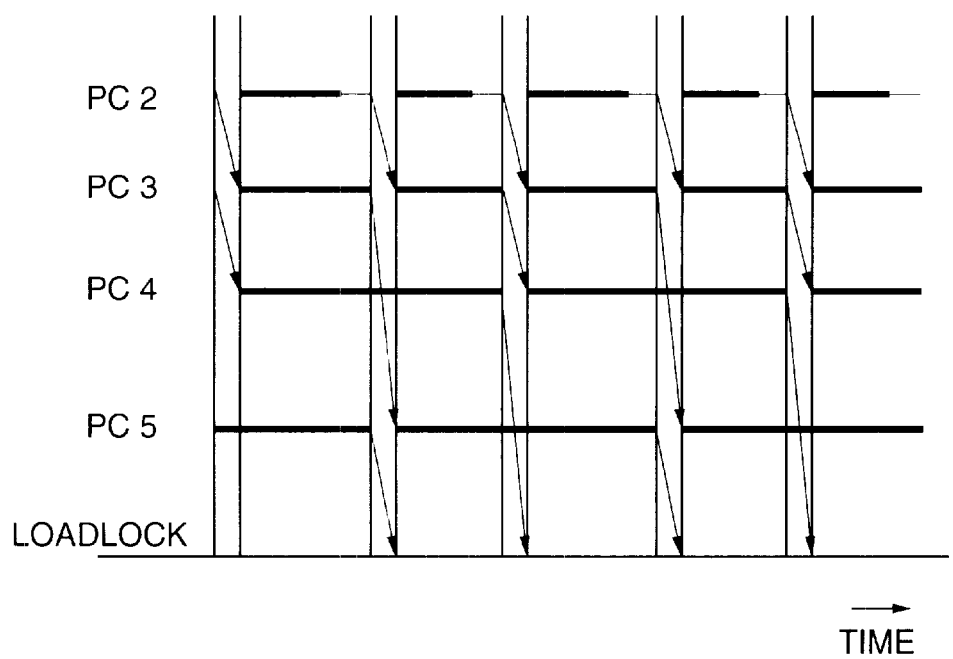
FIG. 2D is a timing chart showing a process for time in the second embodiment of the present invention applied to a dual mode.

Even when the wafer is cooled in another chamber after the barrier metal layer has been deposited as in the second embodiment, the same advantages provided by the first embodiment can be obtained, and the seed layer 108 with restrain agglomeration, as shown in FIG. 6A, can be produced. Moreover, in the case of the second embodiment, the time during which the wafer stays in the barrier metal layer forming chamber is shortened, resulting in a virtually shorter processing time in the barrier metal layer forming chamber. Thus, applying the second embodiment to the dual mode wherein one barrier metal layer forming chamber and two seed layer forming chambers are provided makes it possible to improve the efficiency in the processing in the barrier metal layer forming chamber and to increase the whole throughput, permitting higher productivity to be achieved. FIG. 2D is a timing chart showing a process for time in the second embodiment applied to the dual mode.

The embodiment is an example of the dual damascene method, where a trench and a via hole are covered by a barrier metal layer in the same step, are covered by a seed layer in the same step, and then are filled with a metal in the same step; however, the present invention can be applied also to the single damascene method, where a trench and a via hole are covered by a barrier metal layer in separated steps respectively, are covered by a seed layer in separated steps respectively, and are filled with a metal in separated steps respectively. Also, the embodiment may be applicable to a method, where not only a trench and a via hole are covered by a seed layer and are filled with a metal but also a trench is covered by a seed layer and is filled with a metal generally.

According to these embodiments, seed layers free of agglomeration in the inner surfaces of the recessed portions thereof can be formed, and voids in a metal embedded by the plating method can be prevented. Thus, semiconductor devices with good electrical characteristics can be manufactured with a better yield.

A first example corresponding to the first embodiment in accordance with the present invention will now be described. Referring back to FIG. 1, the first wire 103 is formed on the semiconductor substrate (wafer) on which semiconductor elements have been formed. The first wire is formed by Cu surrounded by the barrier metal layer 102. The barrier metal layer 102 may be a single layer of TiN, Ta, TaN, WN, etc. or a multilayer thereof. Then, the interlayer dielectric 104 is formed. The interlayer dielectric 104 may be a single layer of $SiO_2$, SiON, SiN, etc. formed by, for example, the CVD, or a multilayer thereof, or an inorganic or organic coating type insulating film. In this example, a SiO layer formed by the CVD is used. Subsequently, the trench 105 having a desired wiring pattern and the via hole 106 connected to the first wire 103 are formed by lithography and dry etching.

Next, the sputtering pretreatment, the formation of the barrier metal layer, and the formation of the seed layer are carried out in order by the barrier metal/seed layer forming apparatus 10 shown in FIG. 4. In the sputtering pretreatment, for example, an Ar plasma is produced in the vacuum in the sputtering pretreatment chamber PC1, and etching of 10 nm in terms of an oxide film is performed using Ar ions. In this case, pretreatment using the reduction hydrogen plasma or the sputtering pretreatment may or may not be carried out.

Then, the wafer is carried into the barrier metal layer forming chamber PC2 through the intermediary of a transporting chamber 10 without breaking vacuum. The barrier metal layer 107 is formed by, for example, the sputtering method; however, it may alternatively be formed by the CVD or the atomic layer deposition (ALD) method. The barrier metal layer 107 may be a single layer of TiN, Ta, TaN, WN, etc. or a multilayer thereof. In this case, a Ta/TaN multilayer formed to have a thickness of 20 nm/20 nm by sputtering is used.

The technique for forming the barrier metal layer will now be described in detail. The Ta/TaN multilayer constituting the barrier metal layer is formed under a condition of a processing gas $Ar/N_2$ at a pressure 4 Pa and 1-kW DC power in the barrier metal layer forming chamber PC2 equipped with a Ta target (the layer forming rate being approximately 700 A/min., the formation time being 30 sec., the time required for introducing the processing gas before the layer formation being 15 sec., and the exhaust time after the layer formation being 5 sec.). A wafer is rested on a holder, and the heater incorporated in the holder is set to 100° C. To continuously form the TaN layer and the Ta layer, $N_2$ is interrupted in the middle of the formation, and sputtering is carried out only with Ar. Upon completion of the formation of the barrier metal layer, the processing gas is stopped, and evacuation is performed until $10^{-6}$ Pa or less is reached. Subsequently, the wafer is retained in the chamber PC2 for 50 seconds or more after completion of the layer formation. The holder may be set to ambient temperature or may be cooled to below zero. The set temperature is preferably lower.

Thereafter, the wafer is transferred to the seed layer forming chamber PC3 through the transporting chamber TC without breaking the vacuum. In this example, the seed layer 108 is a Cu layer. The Cu layer may be formed by the CVD; however, the sputtering will be used in this example. In the chamber PC3 equipped with the Cu target, the Cu layer is formed to a thickness of 150 nm under a condition of the Ar processing gas pressure at 8 Pa and 1-kW DC power (the formation rate being 1500 A/min. and the formation time being 60 sec.). Prior to the layer formation, a substrate is held on the holder and cooled.

The details of the cooling will now be described. The holder is cooled to −40° C. by a refrigerant cooled to −40° C. by a chiller. The holder is equipped with an electrostatic chuck (ESC), or the holder may alternatively be a wafer clamping type. The Ar gas is sprayed onto the back surface of the wafer retained by the holder to cool the wafer. The Ar gas sprayed to the wafer has been cooled in the holder cooled to −40° C. The cooling is continued for 60 seconds. In this case, the wafer is cooled by spraying the cooled Ar to the back surface of the wafer. Alternatively, however, the Ar gas may not be used as long as the wafer is cooled by direct thermal conduction from the holder, or another method for cooling the wafer may be used.

After the barrier metal layer and the seed Cu layer are formed as described above, the Cu plating is carried out in another apparatus to embed the trench 105 and the via hole 106. Thereafter, annealing is carried out at 400° C. for 10 minutes in a $N_2$ atmosphere, and polishing is performed by the CMP to form a second metal wire 110 and the via hole 111. This procedure is repeated to create a multilayer structure.

In the first example, after forming the barrier metal layer, the wafer is transferred to the chamber different from the seed layer forming chamber without breaking the vacuum and retained in the chamber for 50 seconds or more. The wafer is then carried into the seed layer forming chamber to form the seed layer. Thus, an excellent seed layer free of agglomeration can be formed. This allows satisfactory void-free embodiment by metal plating to be accomplished in a subsequent step, and a finer wiring structure with good electrical characteristics can be fabricated with a higher manufacturing yield.

A second example corresponding to the second embodiment in accordance with the present invention will now be described. The structure of the dual damascene to be manufactured is the same as that of the first example, so that the same descriptions will not be repeated.

In the manufacturing process, the sputtering pretreatment, the formation of the barrier metal layer, and the formation of the seed Cu layer is carried out in order by the barrier metal/seed layer forming apparatus 10. The sputtering pretreatment is identical to that of the foregoing example, and performed in the sputtering pretreatment chamber PC1.

Then, without breaking the vacuum, the wafer is transferred into the second processing chamber PC2, which acts as the barrier metal layer forming chamber, through the intermediary of the transporting chamber TC. The formation of the barrier metal layer is also performed in the same manner as that in the foregoing example. After the barrier metal layer is formed, the wafer is transferred to the third processing chamber PC3, which acts as the waiting processing chamber, through the intermediary of the transporting chamber TC. In the processing chamber PC3, the wafer is retained for 50 seconds or more. The holder may be set to ambient temperature or cooled to below zero. The temperature is preferably lower. The pressure in the chamber PC3 while the wafer is retained therein is preferably equal or close to that of the barrier metal layer forming chamber PC2.

After that, without breaking the vacuum, the wafer is transferred into the seed layer forming chamber PC4 through the intermediary of the transporting chamber TC to form the Cu layer serving as the seed layer 108. The formation of the Cu layer is also performed in the same manner as that in the foregoing example. After the barrier metal layer and the seed Cu layer are formed as described above, Cu plating is carried out by another apparatus to embed the trench 105 and the via hole 106. Thereafter, annealing is carried out at 400° C. for 10 minutes in the $N_2$ atmosphere, and polishing is performed by the CMP to form the second metal wire 110 and the via hole 111. This procedure is repeated to create a multilayer wiring structure.

Thus, retaining a wafer with the barrier metal layer deposited thereon in the chamber different from the barrier metal layer forming chamber or the seed layer forming chamber provides an advantage of higher productivity or throughput in addition to the same advantages provided by the foregoing example.

Embodiments according to the present invention comprises cooling a semiconductor substrate for such a time which prevents a seed layer from cohering before transferring the semiconductor substrate into a seed layer forming chamber at a predetermined temperature in a barrier metal layer and a seed layer forming process. Therefore, seed layers free of agglomeration in the inner surfaces of the recessed portions thereof can be formed, and voids in a metal embedded by the plating method can be prevented. This allows a finer wiring structure with good electrical characteristics. Thus, semiconductor devices with good electrical characteristics can be manufactured with a better yield. A good seed layer free of agglomeration can be formed, making it possible to prevent voids from being formed in the metal filled using metal plating in a subsequent step.

The present invention is not limited to the above embodiments, and it is contemplated that numerous modifications may be made without departing from the spirit and scope of the invention. The method of manufacturing a semiconductor device, as described above with reference to the figures, is a merely an exemplary embodiment of the invention, and the scope of the invention is not limited to these particular embodiments. For example, the specific layers and materials that are used to create the semiconductor devices of the non-limiting embodiments are merely examples, and one skilled in the art will readily know that the present invention can be applied to devices containing different layers and materials. Accordingly, other structural configurations or other operations may be used, without departing from the sprit and scope of the invention as defined in the claims.

What is claimed is:

1. A method of manufacturing a semiconductor device comprising:
   forming a depression in a semiconductor wafer;
   covering a surface of said depression with a barrier layer in a first chamber; and
   covering a surface of said barrier layer with a seed layer in a second chamber that is provided separately from said first chamber,
   wherein said semiconductor wafer is retained, prior to transporting to said second chamber to cover the surface of said barrier layer with the seed layer, for a period of time such that the seed layer covering the barrier layer is prevented from agglomerating.

2. The method as claimed in claim 1, wherein said semiconductor wafer is retained in such a vacuum atmosphere that has a waiting chamber set at a first temperature which is not greater than a room temperature.

3. The method as claimed in claim 2, wherein said barrier layer is covered with said seed layer while putting said semiconductor wafer on a holder which is set at a second temperature which is lower than said first temperature.

4. The method as claimed in claim 1, wherein said barrier layer is formed in a first chamber and said seed layer is formed in a second chamber that is separated from said first chamber, said semiconductor wafer being retained in said first chamber after forming said barrier layer.

5. The method as claimed in claim 1, further comprising:
   cooling said semiconductor device, after said covering with said barrier layer and prior to loading into said second chamber.

6. A method of manufacturing a semiconductor device comprising:
   forming a depression in a semiconductor wafer;
   covering a surface of said depression with a barrier layer; and
   covering a surface of said barrier layer with a seed layer, wherein said semiconductor wafer is retained, prior to covering the surface of said barrier layer with the seed layer, for a period of time such that the seed layer covering the barrier layer is prevented from agglomerating, and
   wherein covering said surface of said depression and covering said surface of said barrier layer are performed by a multi-chamber apparatus that includes a first chamber, a second chamber, and a transporting chamber coupling said first chamber and said second chamber,
   the covering of said surface of said depression being performed in said first chamber and the covering of said surface of said barrier layer being performed in said second chamber.

7. The method as claimed in claim 6, wherein said semiconductor wafer is retained in said first chamber after forming said barrier layer.

8. The method as claimed in claim 6, wherein said multi-chamber apparatus further includes a waiting chamber coupled with said first chamber and said second chamber by said transporting chamber, wherein said semiconductor wafer is retained in said waiting chamber and said transporting chamber after forming said barrier layer.

9. The method as claimed in claim 8, wherein said semiconductor wafer is retained in such a vacuum atmosphere that has said waiting chamber set at a first temperature which is not greater than a room temperature.

10. The method as claimed in claim 9, wherein said barrier layer is covered with said seed layer while putting said semiconductor wafer on a holder which is set at a second temperature which is lower than said first temperature.

11. The method as claimed in claim 1, wherein said semiconductor wafer is retained in said first chamber during said period of time.

12. The method as claimed in claim 11, wherein semiconductor wafer is retained for 50 seconds or more.

13. The method as claimed in claim 1, wherein said first and second chamber are coupled via a transporting chamber, and said semiconductor wafer is retained in said transporting chamber during said period of time.

14. The method as claimed in claim 13, wherein said semiconductor wafer is retained for 50 seconds or more.

15. A method of manufacturing a semiconductor device, comprising:
   forming a depression in a semiconductor wafer;
   covering a surface of said depression with a barrier layer in a first chamber;
   cooling said semiconductor device covered with said barrier layer;
   loading said cooled semiconductor device into a second chamber; and
   covering a surface of said barrier layer with a seed layer in said second chamber.

16. The method as claimed in claim 15, wherein the second chamber is separate from the first chamber.

17. The method as claimed in claim 15, wherein said first and second chambers are coupled via a transporting chamber, and said semiconductor wafer is retained in said transporting chamber during a period of time.

18. The method as claimed in claim 15, wherein said semiconductor wafer is retained, prior to transporting to said second chamber to cover the surface of said barrier layer with the seed layer, for a period of time such that the seed layer covering the barrier layer is prevented from agglomerating.

* * * * *